(12) United States Patent
Bohlländer et al.

(10) Patent No.: US 9,927,483 B2
(45) Date of Patent: Mar. 27, 2018

(54) METHOD AND DEVICE FOR DETERMINING THE TEMPERATURE CALIBRATION CHARACTERISTIC CURVE OF A SEMICONDUCTOR COMPONENT APPERTAINING TO POWER ELECTRONICS

(71) Applicant: Siemens Aktiengesellschaft, München (DE)

(72) Inventors: Marco Bohlländer, Erlangen (DE); Christian Herold, Chemnitz (DE); Sebastian Hiller, Kastl (DE)

(73) Assignee: SIEMENS AKTIENGESELLSCHAFT, München (DE)

( * ) Notice: Subject to any disclaimer, the term of this patent is extended or adjusted under 35 U.S.C. 154(b) by 570 days.

(21) Appl. No.: 14/385,936

(22) PCT Filed: Mar. 16, 2013

(86) PCT No.: PCT/DE2013/000156
§ 371 (c)(1),
(2) Date: Sep. 17, 2014

(87) PCT Pub. No.: WO2013/139325
PCT Pub. Date: Sep. 26, 2013

(65) Prior Publication Data
US 2015/0032404 A1 Jan. 29, 2015

(30) Foreign Application Priority Data

Mar. 17, 2012 (DE) .................. 10 2012 005 815

(51) Int. Cl.
*G01R 31/26* (2014.01)

(52) U.S. Cl.
CPC ..... *G01R 31/2603* (2013.01); *G01R 31/2619* (2013.01)

(58) Field of Classification Search
CPC ..... G01R 31/2603; G01R 31/261; G01S 5/00; G01S 5/068; G01S 5/06808; G01S 5/0617
(Continued)

(56) References Cited

U.S. PATENT DOCUMENTS

| | | | | |
|---|---|---|---|---|
| 6,853,657 B2 * | 2/2005 | Althaus | ............... | H01S 5/06808 372/33 |
| 8,348,505 B2 * | 1/2013 | Nguyen Hoang | ....... | G01K 7/01 374/1 |

FOREIGN PATENT DOCUMENTS

| | | |
|---|---|---|
| DE | 30 37 192 A1 | 5/1982 |
| DE | 38 32 273 A1 | 3/1990 |
| EP | 2 336 741 A1 | 6/2011 |
| JP | H 07135731 A | 5/1995 |

OTHER PUBLICATIONS

Siegal, B. Ed-Anonymous: "Practical Considerations in High Power LED Junction Temperature Measurements", Electronics Manufacturing and Technology, 31st International Conference on, IEEE, Piscataway, NJ, USA, Nov. 8, 2007 (Nov. 8, 2007), pp. 62-66, XP031233432, ISBN: 978-1-4244-0729-3, the whole document page 4, left-hand column; US; Nov. 8, 2007.

(Continued)

*Primary Examiner* — John H Le
(74) *Attorney, Agent, or Firm* — Henry M. Feiereisen LLC

(57) ABSTRACT

The temperature calibration characteristic curve of a semiconductor component can be readily determined by interconnecting the power connections of the semiconductor component with a first current source for a load current, a second current source for a measurement current and a voltmeter for measuring the voltage drop across the power connections. Furthermore, the semiconductor component is connected to a data processing system and heated by the dissipated power at time intervals when the first current (Continued)

source is connected, and the voltage drop across the power or auxiliary connections is measured when the first current source disconnected and the second current source is connected between the intervals after a time duration determined by the thermal main time constant of the semiconductor component. The temperature of the semiconductor component is separately measured and the temperature calibration characteristic curve is obtained by correlating the measured temperature with the voltage drop.

8 Claims, 2 Drawing Sheets

(58) Field of Classification Search
USPC ...... 702/60, 64, 107, 130, 132, 85; 374/178; 372/29.02, 38.02
See application file for complete search history.

(56) References Cited

OTHER PUBLICATIONS

Berlioux, R, "Le test des semiconducteurs de puissance", Toute L'Electronique, Societe Des Editions Radio, Paris, No. 501, Feb. 1, 1985, pp. 59-62, XP002143985, the whole document; FR; Feb. 1, 1985.

Ishiko, M. et al.: "A Simple Approach for Dynamic Junction Temperature Estimation of IGBTs on PWM Operating Conditions", Power Electronics Specialists Conference, 2007, PESC 2007, IEEE, Piscataway, NJ, USA, Jun. 17, 2007, pp.916-920, XP031218406,ISBN: 97B-1-4244-0654-8, the whole document; US; Jun. 17, 2007.

* cited by examiner

METHOD AND DEVICE FOR DETERMINING THE TEMPERATURE CALIBRATION CHARACTERISTIC CURVE OF A SEMICONDUCTOR COMPONENT APPERTAINING TO POWER ELECTRONICS

CROSS-REFERENCES TO RELATED APPLICATIONS

This application is the U.S. National Stage of International Application No. PCT/DE2013/000156, filed Mar. 16, 2013, which designated the United States and has been published as International Publication No. WO 2013/139325 and which claims the priority of German Patent Application, Serial No. 10 2012 005 815.2, filed Mar. 17, 2012, pursuant to 35 U.S.C. 119(a)-(d).

BACKGROUND OF THE INVENTION

The invention relates to a method and a device for determining the temperature calibration characteristic curve of a semiconductor component appertaining to power electronics.

Semiconductor components appertaining to power electronics are for example known bipolar transistors with insulated gate electrodes (insulated-gate bipolar transistors, abbreviated to IGBT). Such a component combines the benefits of a bipolar transistor in the form of good on-state behavior and a high blocking voltage with the benefits of a field effect transistor in the form of largely zero-power activation.

Four different basic types are identified in such cases. Depending on the doping of the basic material, n-channel and p-channel power semiconductors can be fabricated. These are divided in each case into a self-conducting and, a self-blocking type. The semiconductor component has the connections collector (C) and emitter (E). The further gate connection (G) serves in all types as a control connection.

To obtain the calibration characteristic curve $U_{CE}(T)$, also referred to as $V_{CE}(T)$, the semiconductor components are passively brought to specific temperature levels and the corresponding $U_{CE}$ voltage is measured there, while a small measurement current $I_{meas}$ is flowing. The heating up resulting from this process can be ignored.

The passive heating up occurs through an external temperature feed. For this purpose the semiconductor components are brought into an encapsulated heating device and subjected to a constant temperature until such time as the temperature of the semiconductor has reached that of the heating device. A homogeneous temperature distribution obtains in the semiconductor. With the aid of the injected measurement current $I_{meas}$ a measurement point for the calibration characteristic curve is recorded.

Depending on the number of measurement points needed, a number of temperature levels are thus approached and measured there. The entire process of obtaining the characteristic temperature curve lasts several hours. The calibration process takes place outside the subsequent deployment site. Different structures are used for the measurement and calibration, so that measurement deviations cannot be excluded.

The publication DE 30 37 192 A1 discloses a test method for semiconductor arrangements which delivers characteristic data of the semiconductor at different temperatures in a relatively short time. In this invention the semiconductor arrangement is heated up locally by means of a heating element and the characteristic data is measured at the different temperatures. The test circuit for recording the measurement result remains at room temperature during the method.

Publication DE 38 32 273 A1 contains a method and an arrangement for determining the thermal resistance of IGBT components. For this method the collector-emitter voltage is first measured in the cold state of the IGBT component to be tested, subsequently an electrical power impulse defined in relation to power and duration is applied to the IGBT component and in a second measurement the collector-emitter voltage immediately after the end of the power impulse is determined.

SUMMARY OF THE INVENTION

The underlying object of the invention is to determine the characteristic temperature calibration curve of a semiconductor component in a simple manner.

The method and devices for determining the characteristic temperature calibration curve of a semiconductor component appertaining to power electronics are characterized in particular by the temperature calibration characteristic curve being simple and economically low-cost to determine.

To this end the power connections of the semiconductor component will be or are
  interconnected with a first current source for a load current,
  interconnected with a second current source for a measurement current,
  interconnected to a voltmeter for measuring the voltage falling via either the power connections or via auxiliary connections linked to the power connections.

Furthermore the semiconductor component connected to a data processing system
  is heated up at intervals via its power loss with the first current source connected,
  the voltage dropping between the intervals via the power or auxiliary connections with the first current source switched off and the second current source connected is measured as values representing the temperature after a period of time determined by the thermal main time constant of the semiconductor component,
  at the same time the temperature is detected by means of at least one temperature sensor coupled to the semiconductor element and interconnected with the data processing system and
  the respective temperature is assigned to the voltage value.

The voltage values and the temperatures, after an approximation, form/are the calibration characteristic curve of the semiconductor component.

The method and the device are thus characterized in that the temperature calibration characteristic curve will be obtained by active heating up of the test items through their own power loss. During the calibration in the measurement setup the module in the form of the semiconductor component appertaining to power electronics will be actively heated up, meaning that it is heated up with a load current.

The heating up process occurs at a number of intervals. The semiconductor component is not cooled, only the thermal capacitors of the water cooler or of the air cooler charge when the fan is switched off. The chip in the module is actively heated for a defined time by the load current and the forward voltage set thereby. After the load current is switched off the measurement current is injected via the power connections. Naturally the measurement current can also be injected when the load current is flowing, since the heating resulting from the flowing measurement current is negligible compared to that resulting from the load current.

At the start the temperature falls sharply via the chip. The thermal capacitances of the semiconductor component discharge via the corresponding thermal resistances into the cooler. In this case the chip temperature approximately reaches the temperature of the heatsink after a specific time. Thereafter both fall at the same speed. The time until the two temperatures are roughly at the same level can be estimated from the greatest thermal main time constant of the semiconductor component. The thermal main time constant is able to be determined from the manufacturer specifications, is a specification determined by the manufacturer or is able to be estimated manually.

Surprisingly it has been shown that the temperature of both the chip and also the heatsink are rapidly at the same level. During the cooling down the voltage dropping via the power connections or the auxiliary connections is able to be allocated a temperature value. This is done by means of the temperature sensor connected to the data processing system and coupled to the semiconductor component.

After the measurement a new heating up and cooling down process takes place, by which a new measurement point is set. The cooling down phase is to be selected long enough for a temperature above the start temperature of the predecessor interval to be set.

This process of heating up and cooling down is repeated until such time as the desired upper point of the calibration characteristic curve in relation to the temperature is reached. The heating up resulting from the flowing measurement current is negligible.

The characteristic temperature calibration curve is obtained as measurement points in a diagram and with an approximation.

The method is controlled, the measurement values are stored and the evaluation is undertaken by means of the data processing system.

The method and the device are characterized by a very short period of time. While the known method, depending on the module size, needs several hours, typically two to three hours, just a few minutes, for example three to six minutes, are needed by the active heating up of the power semiconductor. Naturally forced cooling via a flowing or streaming medium can also be undertaken during the cooling-off, so that the temperatures of the chip and of the case approach each other more quickly. This cooling can be undertaken continually or in stages.

The calibration can advantageously be undertaken at the subsequent deployment site, wherein upgrading times are also dispensed with.

In accordance with an advantageous embodiment, the intervals determine the heating up and the time between the intervals determines the cooling down and measurement. The heating up is done in stages, wherein the period of time for the cooling down is long enough for the temperature to be greater than the temperature of the measurement point resulting from the predecessor interval.

During the cooling down between the intervals the chip and the heatsink of the semiconductor component, according to the development of claim 3, after a whole number multiple of the thermal main time constant, are largely at the same temperature level. The voltage falling via the power or auxiliary connections and the temperature are then measured.

As a continuation according to the development of claim 4, the multiple of the thermal main time constant is four times or more than four times the thermal main time constant.

The current of the first current source, according to the development of claim 5, is 25% to 100% of the rated current of the semiconductor component.

According to another advantageous embodiment, the semiconductor component is an insulated gate bipolar transistor, a power MOSFET (MOSFET: Metal-Oxide-Semiconductor Field Effect Transistor), a power JFET (JFET: junction fet), a thyristor, a diac, a triac or a diode.

BRIEF DESCRIPTION OF THE DRAWING

A basic exemplary embodiment of the invention is shown in the drawings in each case and will be subsequently described in greater detail.

In the drawings.

DETAILED DESCRIPTION OF PREFERRED EMBODIMENTS

In the exemplary embodiment below a method and a device for determining the temperature calibration characteristic curve of an insulated gate bipolar transistor as a semiconductor component 3 appertaining to power electronics together will be explained in greater detail.

A device for determining the temperature calibration characteristic curve of an insulated gate bipolar transistor 3 as semiconductor component 3 appertaining to power electronics essentially consists of a first current source 1 for a load current $I_{load}$, a second current source 2 for a measurement current $I_{meas}$, a voltmeter V for measuring the voltage $U_{CE}$ falling over the collector-emitter path, a data processing system and a temperature sensor coupled to the bipolar transistor 3.

Figure 1:
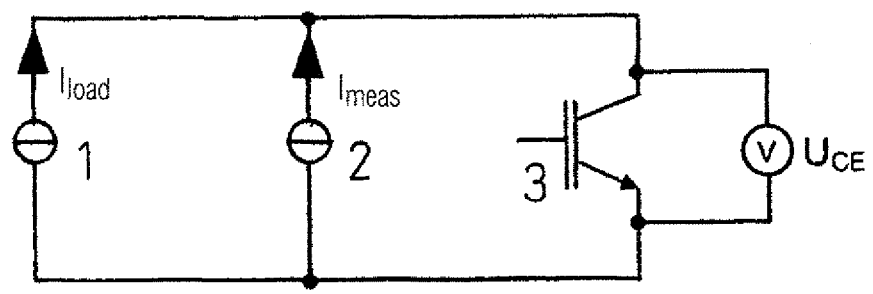
FIG. 1 shows a device for active determination of the temperature calibration characteristic curve of an insulated gate bipolar transistor as a semiconductor component appertaining to power electronics and FIG. 2 shows a curve of a measurement.

FIG. 1 shows a device for active determination of the temperature calibration characteristic curve of an insulated gate bipolar transistor D as a semiconductor component 3 appertaining to power electronics in a basic diagram.

The insulated gate bipolar transistor 3 will be referred to below as a power semiconductor 3.

The collector-emitter path of the power semiconductor 3 is interconnected with the first power source 1 for a current $I_{load}$ less than or equal to the rated current, the second power source 2 for a measurement current $I_{meas}$, the voltmeter V for measuring the voltage $U_{CE}$ falling via the collector-emitter path and the data processing system for controlling the measurement, storage of the measurement data and evaluation.

The data processing system is further connected to the temperature sensor. The collector and the emitter are the power connections or the power and the auxiliary connections of the power semiconductor 3.

The data processing system and the temperature sensor are not shown in FIG. 1.

The power semiconductor 3 will be heated up via its power loss at specific and predetermined intervals with the first current source 1 connected. The current $I_{load}$ of the first current source 1 in this case is 50% of the rated current of the power semiconductor 3 for example.

The process is controlled by means of the data processing system.

With the first current source 1 switched off and the second current source 2 connected the voltage $U_{CE}$ dropping via the collector-emitter path is measured between the intervals after a period of time $t_{meas}$ defined by the thermal main constant of the power semiconductor as values representing the temperature. At the same time the temperature will be measured by a temperature sensor coupled to the power semiconductor 3. The values will be stored on a data processing system and processed so that the values, after a linear approximation for example, form the calibration characteristic curve of the power semiconductor 3.

Figure 2:
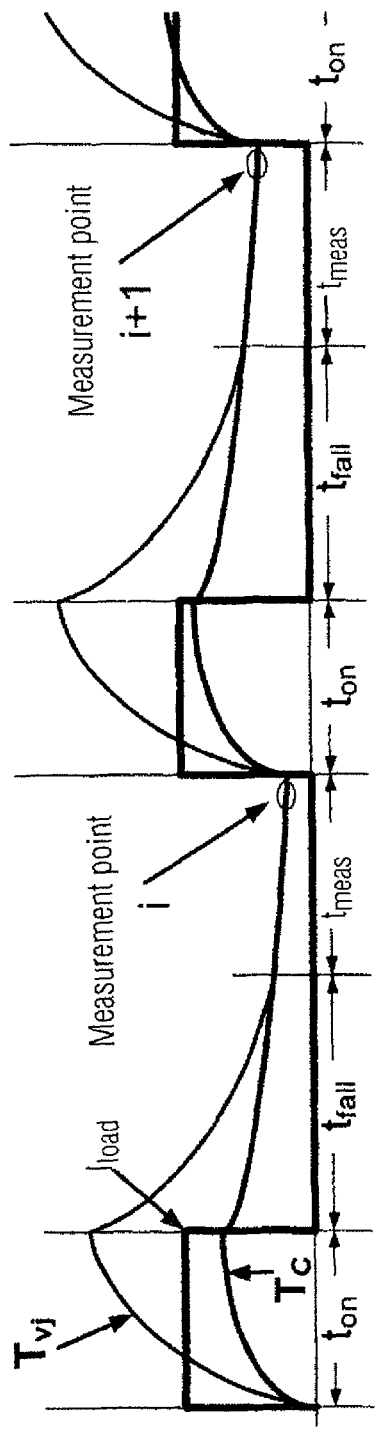

FIG. 2 shows a curve of a measurement in a basic diagram.

The intervals $t_{on}$ determine the heating up and the time $t_{fall}$ and $t_{meas}$ between the intervals $t_{on}$ determine the cooling down and measurement. The heating up takes place in stages, wherein the current $I_{load}$ flows.

The periods of time $t_{fall}$ and $t_{meas}$ are long enough for the temperature of the measurement point i+1 to be greater than the temperature of the measurement point i resulting from the predecessor interval $t_{on}$.

To this end FIG. 2 shows the temperature curve $T_{vj}$ for the chip temperature, wherein vj stands for virtual junction, and the temperature curve $T_C$ stands for the housing temperature of the power semiconductor 3, wherein C stands for case.

The chip of the power semiconductor 3 and the heatsink of the power semiconductor 3 are largely at the same temperature level during the cooling down between the intervals after five times the thermal main time constant, wherein especially in this case the measurement is undertaken via the voltage (measurement points i and i+1) falling over the collector-emitter path.

The values and the associated temperatures, after a linear approximation in the data processing system, form the calibration characteristic curve of the power semiconductor 3 for example.

The invention claimed is:

1. An improved method for determining a temperature calibration characteristic curve of a power semiconductor component of power electronics using a data processing system, comprising the steps of:
   interconnecting power connections of the power semiconductor component with a first current source adapted to provide a load current, with a second current source adapted to provide a measurement current, and with a voltmeter adapted to measure a voltage drop either across the power connections or across auxiliary connections connected to said power connections,
   heating the power semiconductor component during specified time intervals by dissipating power provided by the first current source in the power semiconductor component,
   measuring the voltage drop across the power connections or across said auxiliary connections between said specified time intervals with the first current source disconnected and the second current source connected, and simultaneously measuring a temperature of the power semiconductor component using at least one temperature sensor connected to the data processing system after a period of time determined by a main thermal time constant of the power semiconductor component has elapsed since the last specified time interval, as a measured temperature value corresponding to a voltage drop of the power semiconductor component, and
   providing the simultaneously measured voltage drop and temperature to the data processing system, said data processing system assigning the temperature of the at least one temperature sensor to the corresponding voltage drop, and a temperature calibration characteristic curve of the power semiconductor component using a plurality of measured voltage drops and a plurality of corresponding simultaneously measured temperatures.

2. The method of claim 1, wherein the specified time intervals determine heating of the power semiconductor component and the period of time between the specified time intervals determines a cool-down and the measurement of the value representing the temperature, wherein heating of the power semiconductor component occurs in stages, wherein the period of time for the cool-down is sufficiently long so that the temperature is higher than the temperature of a measurement point resulting from a preceding interval.

3. The method of claim 1, wherein a chip and a heat sink of the power semiconductor component during cool-down between the specified time intervals after an integer multiple of the thermal main time constant are largely at an identical temperature level, at which time the voltage drop across the power connections or the auxiliary connections and the temperature are measured.

4. The method of claim 3, wherein the integer multiple of the thermal main constant is four times the thermal main constant.

5. The method of claim 3, wherein the integer multiple of the thermal main constant is more than four times the thermal main constant.

6. The method of claim 1, wherein the current of the first current source is 25% to 100% of a rated current of the semiconductor component.

7. An improved device for determining a temperature calibration characteristic curve of a power semiconductor component of power electronics, comprising:
   a first current source adapted to be connected to the power semiconductor component to supply a load current,
   a second current source adapted to be connected to the power semiconductor component to supply a measurement current,
   a voltmeter adapted to be connected across power connections or across auxiliary connections connected to the power connections to measure a voltage drop across the power connections or across the auxiliary connections, and
   a data processing system configured to:
   a) connect the first current source to supply a load current from the first current source at during specified time intervals to heat the power semiconductor component by dissipating power in the power semiconductor component,
   b) disconnect the first current source and connect the second current source to supply a measurement current to the power semiconductor component,
   c) after a period of time determined by a thermal main time constant of the power semiconductor component has elapsed since disconnecting the first current source, measure the voltage drop across the power connections or across the auxiliary connections, between the specified time intervals with the first current source disconnected and the second current source connected, as a voltage drop corresponding to a simultaneously measured temperature of the power semiconductor component and simultaneously measure a temperature of the power semiconductor component using at least one temperature sensor coupled to the power semiconductor component and connected to the data processing system, and d) form a temperature calibration characteristic curve of the power semiconductor component using a plurality of the measured voltage drops and the corresponding simultaneously measured temperatures of the power semiconductor component produced by dissipating power in the power semiconductor component.

8. The device of claim 7, wherein the power semiconductor component is an insulated gate bipolar transistor, a power MOSFET, a power JFET, a thyristor, a diac, a triac or a diode.

* * * * *